(12) United States Patent
Abe et al.

(10) Patent No.: US 8,831,081 B2
(45) Date of Patent: Sep. 9, 2014

(54) DIGITAL FILTER DEVICE, DIGITAL FILTERING METHOD AND CONTROL PROGRAM FOR THE DIGITAL FILTER DEVICE

(75) Inventors: Junichi Abe, Minato-ku (JP); Hidemi Noguchi, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/393,066

(22) PCT Filed: Aug. 18, 2011

(86) PCT No.: PCT/JP2011/069103
§ 371 (c)(1),
(2), (4) Date: Feb. 28, 2012

(87) PCT Pub. No.: WO2012/029613
PCT Pub. Date: Mar. 8, 2012

(65) Prior Publication Data
US 2013/0287390 A1 Oct. 31, 2013

(30) Foreign Application Priority Data

Sep. 1, 2010 (JP) .................................. 2010-195370

(51) Int. Cl.
*H03H 7/30* (2006.01)
*H04B 10/61* (2013.01)
*H04B 3/14* (2006.01)
*H03H 17/02* (2006.01)
*H04L 25/03* (2006.01)

(52) U.S. Cl.
CPC ........ *H04B 10/616* (2013.01); *H04L 25/03057* (2013.01); *H04L 25/03178* (2013.01); *H04L 25/03159* (2013.01); *H04L 25/03038* (2013.01); *H03H 2218/04* (2013.01); *H04L 2025/03401* (2013.01); *H04L 2025/03636* (2013.01); *H04B 3/142* (2013.01); *H03H 17/0202* (2013.01)
USPC .......................................... 375/232; 375/350

(58) Field of Classification Search
USPC .......... 375/232, 350, 254, 278, 284–285, 346
See application file for complete search history.

(56) References Cited

U.S. PATENT DOCUMENTS

| | | | | |
|---|---|---|---|---|
| 5,157,395 A | * | 10/1992 | Del Signore et al. | 341/143 |
| 5,596,677 A | * | 1/1997 | Jarvinen et al. | 704/220 |
| 5,774,564 A | * | 6/1998 | Eguchi et al. | 381/71.11 |
| 5,864,798 A | * | 1/1999 | Miseki et al. | 704/225 |

(Continued)

FOREIGN PATENT DOCUMENTS

| | | |
|---|---|---|
| CN | 1320316 A | 10/2001 |
| JP | 57-183139 A | 11/1982 |

(Continued)

*Primary Examiner* — Emmanuel Bayard
(74) *Attorney, Agent, or Firm* — Sughrue Mion, PLLC

(57) ABSTRACT

In order to solve a problem of achieving distortion compensation with high accuracy, a digital filter device includes a first distortion compensation filter unit for conducting distortion compensation of first waveform distortion included in an inputted signal through digital signal processing, a first filter coefficient setting unit for setting a filter coefficient of the first distortion compensation filter unit, a second distortion compensation filter unit for compensating second waveform distortion included in a signal outputted from the first distortion compensation filter unit, and a second filter coefficient setting unit for setting a filter coefficient of the second distortion compensation filter unit based on the filter coefficient set by the first filter coefficient setting unit.

11 Claims, 10 Drawing Sheets

(56) References Cited

U.S. PATENT DOCUMENTS

| | | | |
|---|---|---|---|
| 6,009,083 A * | 12/1999 | Flanagan et al. | 370/287 |
| 6,195,383 B1 * | 2/2001 | Wishart et al. | 375/136 |
| 6,873,704 B1 * | 3/2005 | Park | 379/406.08 |
| 6,987,812 B1 | 1/2006 | Schenk | |
| 7,099,822 B2 * | 8/2006 | Zangi | 704/226 |
| 7,613,260 B2 * | 11/2009 | Eliaz et al. | 375/349 |
| 7,852,589 B2 * | 12/2010 | Ikeda et al. | 360/65 |
| 7,860,185 B2 * | 12/2010 | Utsunomiya et al. | 375/296 |
| 7,912,119 B2 * | 3/2011 | Chen et al. | 375/232 |
| 7,965,765 B2 * | 6/2011 | Kanai et al. | 375/229 |
| 2001/0024242 A1 * | 9/2001 | Takeuchi | 348/746 |
| 2005/0147192 A1 * | 7/2005 | Yamamoto et al. | 375/345 |
| 2007/0116162 A1 * | 5/2007 | Eliaz et al. | 375/350 |
| 2008/0036883 A1 * | 2/2008 | Hara | 348/246 |
| 2008/0159460 A1 * | 7/2008 | Kanai et al. | 375/373 |
| 2009/0052516 A1 * | 2/2009 | Chen et al. | 375/232 |
| 2009/0129229 A1 * | 5/2009 | Park et al. | 369/59.22 |
| 2009/0190647 A1 * | 7/2009 | Utsunomiya et al. | 375/232 |
| 2009/0317092 A1 * | 12/2009 | Nakashima et al. | 398/204 |
| 2010/0054759 A1 * | 3/2010 | Oda et al. | 398/202 |
| 2010/0142946 A1 * | 6/2010 | Liu et al. | 398/29 |
| 2010/0209121 A1 * | 8/2010 | Tanimura | 398/202 |
| 2010/0266134 A1 * | 10/2010 | Wertz et al. | 381/71.1 |

FOREIGN PATENT DOCUMENTS

| | | |
|---|---|---|
| JP | 62-104211 A | 5/1987 |
| JP | 2-235442 A | 9/1990 |
| JP | 4-362808 A | 12/1992 |
| JP | 2002-526981 A | 8/2002 |
| JP | 2008-205654 A | 9/2008 |
| WO | 00/19675 A1 | 4/2000 |

* cited by examiner (a)

(b)

(a) AMOUNT OF SKEW COMPENSATION CASE OF −x SAMPLE    (b) AMOUNT OF SKEW COMPENSATION CASE OF +x SAMPLE

DIGITAL FILTER DEVICE, DIGITAL FILTERING METHOD AND CONTROL PROGRAM FOR THE DIGITAL FILTER DEVICE

CROSS REFERENCE TO RELATED APPLICATION

This application is a National Stage of International Application No. PCT/JP2011/069103, filed on Aug. 18, 2011, claiming priority based on Japanese Patent Application No. 2010-195370, filed Sep. 1, 2010, the contents of all of which are incorporated herein by reference in their entirety.

TECHNICAL FIELD

The invention relates to a digital filter device, a digital filtering method and a control program of the digital filter device which are employed in a digital coherent optical communication.

BACKGROUND ART

In these days, importance of a digital coherent optical communication technology is increasing, as a demand for a network with high speed and large capacity is increasing. A digital coherent reception system is also called an intradyne reception system. The digital coherent reception system can achieve receiving sensitivity improvement of 3 dB to 6 dB or more, compared with a modulation system, like OOK (on-off keying) and DPSK (differential quadrature phase shift keying). The digital coherent reception system advantageously has high compatibility with a multi-level modulation system, like a polarization multiplexing system and QAM (quadrature amplitude modulation).

FIG. 10 is a diagram illustrating a configuration of a digital coherent receiver 400 described in Patent Document 1 and Non-Patent Document 1. A signal light entering the digital coherent receiver is a multiplexed signal (DP-QPSK signal light) with 4 channels (Ix, Qx, Iy, Qy) using a Polarization multiplexing (DP: dual-polarization)-QPSK (quadrature phase shift keying) signal.

The DP-QPSK signal is separated to each channel of Ix, Qx, Iy, and Qy at a polarization diversity 90-degree hybrid 401. The separated signals are converted into analog electric signals per channel at respective optical-electric (O/E) converters 402-1 to 402-4. Respective O/E-converted signals are converted into digital signals at respective A/D (analog to digital) converters 403-1 to 403-4 which carry out sampling in synchronization with a reference sampling clock (CLK) 405.

The digital signals converted by the A/D converters 403-1 to 403-4 enter a digital signal processing circuit 404. A background of why the digital signal processing circuit 404 is employed in the digital coherent reception system and a function of the digital signal processing circuit 404 are described below.

The coherent receiver which does not carry out digital signal processing includes a problem that it is difficult to keep stable reception due to off-set of a frequency and a phase of a LO (local oscillator) light and polarization fluctuation.

In the meantime, as an electronic device technology improves, it has become possible to use a high-speed A/D converter for signal processing of a high-speed communication device. As a result, by carrying out digital signal processing for a signal converted to a digital signal, it has become possible to compensate off-set of a frequency and a phase of a LO light which has been a problem of the coherent reception system which does not carry out digital signal processing. The digital signal processing enables to compensate polarization fluctuation of an optical signal.

As described above, the digital coherent reception system achieves stable and accurate coherent reception compared with the coherent reception system which does not carry out digital signal processing.

Furthermore, in the digital coherent reception system, it is possible to add compensation of wavelength dispersion and high waveform equalization to a signal in addition to compensation of offset of a frequency and a phase and compensation of polarization fluctuation.

Non-Patent Document 2 describes a skew compensation technology that is a technology for compensating waveform distortion used in the digital coherent receiver. Non-Patent Document 2 describes the technology which achieves highly accurate skew compensation through quadratic function approximation on adjacent sampling points and sampling points before and behind the adjacent sampling points by using FIR (finite impulse response) filter.

Since a high-speed A/D converter becomes widespread, in backplane transmission which connects circuit substrates to each other, it becomes possible to conduct high-level waveform equalization and highly accurate digital clock extraction, like MLSE (most likelihood sequence estimation) using digital signal processing or the like, in order to tackle the problem of interference between codes and deterioration of jitter characteristics due to band shortage of a transmission path.

PRIOR ART DOCUMENT

Patent Document

[Patent Document] Publication of unexamined patent application JP2008-205654 A

Non-Patent Document

[Non-Patent Document 1]
Seb J. Savory, "Digital filters for coherent optical receivers," Optics Express Vol. 16, No. 2, p. 804-817 (January 2008)
[Non-Patent Document 2]
Tanimura et al, "A Simple Digital Skew Compensator for Coherent Receiver," in Proceedings of European Conference and Exhibition on Optical Communication (ECOC) 2009, Vienna, Austria, paper 7.3.2 (2009)

DISCLOSURE OF THE INVENTION

Technical Problem

In digital signal processing for an ultrahigh-speed signal of more than tens of GS/s (samples per second), a sampling rate of an A/D converter cannot be fully increased because of the limit of operation speed and consumed power of the A/D converter. Due to the limit, an over-sampling operation is usually conducted at the rate of a baud rate of the signal or at most twice the rate thereof. As a result, in digital signal processing for an ultrahigh-speed signal, a distortion compensation filter for compensating various waveform distortions has difficulty in obtaining sufficient characteristics.

In next generation optical communication system in which a transmission rate is more than 100 Gb/s (gigabit per second), a multiplexed signal with 4 channels using DP-QPSK illustrated in FIG. 10 may be employed. In the DP-QPSK system, skew (propagation delay difference) is generated between channels due to phase shift which occurs at an optical front end section, like 90-degree hybrid, TIA (transimpedance amplifier) and the like, and due to group delay characteristics. The skew which is generated between channels deteriorates performance of the system. The skew of the DP-QPSK signal, therefore, has to be compensated with high accuracy by using a distortion compensation filter.

An object of the invention is to provide a digital filter device to solve the problem of achieving highly accurate distortion compensation.

Technical Solution

The digital filter device of the invention includes a first distortion compensation filter unit for conducting distortion compensation of first waveform distortion included in an inputted signal through digital signal processing, a first filter coefficient setting unit for setting a filter coefficient of the first distortion compensation filter unit, a second distortion compensation filter unit for compensating second waveform distortion included in a signal outputted from the first distortion compensation filter unit, and a second filter coefficient setting unit for setting a filter coefficient of the second distortion compensation filter unit based on the filter coefficient set by the first filter coefficient setting unit.

A digital filtering method of the invention includes setting a filter coefficient of a first distortion compensation filter unit, compensating distortion of first waveform distortion included in an inputted signal, setting a filter coefficient of a second distortion compensation filter unit based on the filter coefficient of the first distortion compensation filter unit, and compensating second waveform distortion included in a signal outputted from the first distortion compensation filter unit.

A control program of the digital filter device of the invention causes a computer of the digital filter device to function as a first distortion compensation filter unit for conducting distortion compensation of first waveform distortion included in an inputted signal through digital signal processing, a first filter coefficient setting unit for setting a filter coefficient of the first distortion compensation filter unit, a second distortion compensation filter unit for compensating second waveform distortion included in a signal outputted from the first distortion compensation filter unit, and a second filter coefficient setting unit for setting a filter coefficient of the second distortion compensation filter unit based on the filter coefficient set by the first filter coefficient setting unit.

Advantageous Effect of the Invention

The digital filter device of the invention includes advantage of achieving distortion compensation with advanced controllability, high performance and high accuracy.

BEST MODE FOR CARRYING OUT THE INVENTION

Exemplary embodiments of the invention are described in detail with reference to drawings.

First Exemplary Embodiment

Figure 1:
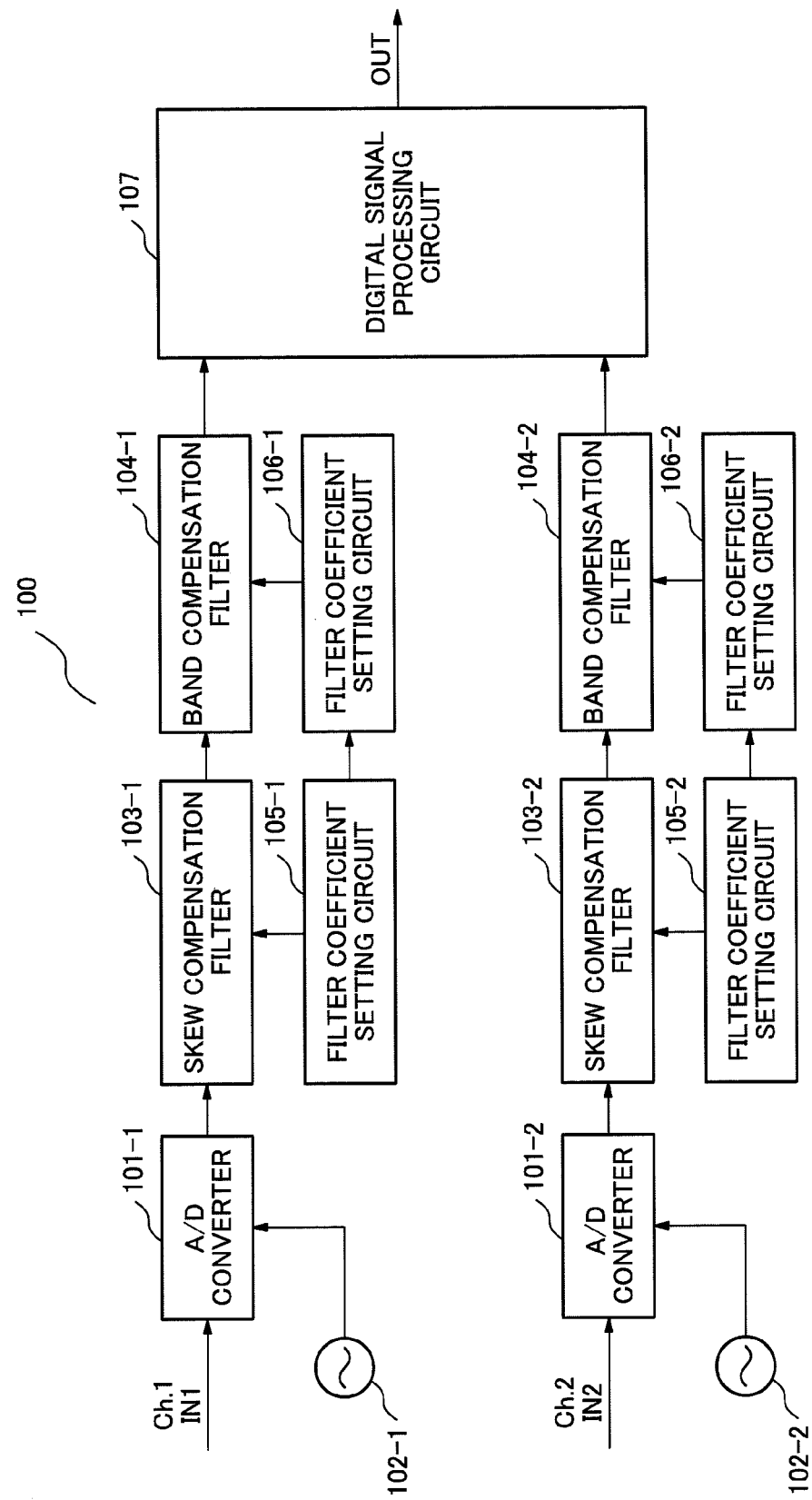
FIG. 1 is a diagram illustrating a configuration of a digital receiver related to a first exemplary embodiment of the invention.

FIG. 1 illustrates a configuration of a digital receiver related to a first exemplary embodiment of the invention. In FIG. 1, a digital receiver 100 includes an A/D converter 101, an A/D converter identification clock 102, a skew compensation filter 103, and a band compensation filter 104. The digital receiver 100 further includes a filter coefficient setting circuit 105 related to the skew compensation filter, a filter coefficient setting circuit 106 related to the band compensation filter, and a digital signal processing circuit 107. In FIG. 1, when a plurality of units having the same function are arranged, notation for the units in the drawing is distinguished by adding "-1" and "-2" to reference numerals thereof. In following descriptions, if it is unnecessary to particularly distinguish them, for example, "A/D converter 101-1" and "A/D converter 101-2" are described as "A/D converter 101".

An operation of the digital receiver 100 related to the first exemplary embodiment of the invention is described below. A transmission signal transmitted from a transmitter which is not shown enters inputs (IN1, IN2) of the digital receiver 100 through a transmission path which is not shown. The A/D converter 101 converts signals, inputted in IN1 and IN2, which are analog electric signals into digital signals in synchronization with the A/D converter identification clock 102 connected thereto. The skew compensation filter 103 conducts skew (phase) adjustment on the converted digital signals. At this time, a filter coefficient of the skew compensation filter 103 is set so that a desired amount of skew compensation is obtained, by the filter coefficient setting circuit 105 related to the skew compensation filter.

Next, with respect to signals, skew of which is compensated, band adjustment is conducted with the band compensation filter 104. Outputs of the band compensation filter 104 enter the digital signal processing circuit 107. The filter coefficient setting circuit 106 sets a filter coefficient of the band compensation filter 104 so as to achieve a desired amount of band compensation.

The digital receiver 100 shown in FIG. 1 includes the A/D converter identification clocks 102, the skew compensation filters 103, the band compensation filters 104, the filter coefficient setting circuits 105 and the filter coefficient setting circuits 106 for 2 channels. An outputted signal from the band compensation filter 104 of each channel enters the digital signal processing circuit 107.

Using the inputted digital signals of 2 channels, the digital signal processing circuit 107 removes (compensate) waveform distortion included in the signals and demodulates data. FIG. 1 illustrates 2 channels as the number of channels. The number of channels of the digital receiver 100 is not limited to 2 channels.

The digital signal processing circuit 107 has to conduct signal processing while inputted signals of a plurality of channels are synchronized, that is, while no skew occurs between the channels. When skew between the channels exists in a signal which enters the digital receiver 100, or when phase shift exists in identification timing of the A/D converter identification clock 102, the skew difference is compensated by using the skew compensation filter 103.

Figure 2:
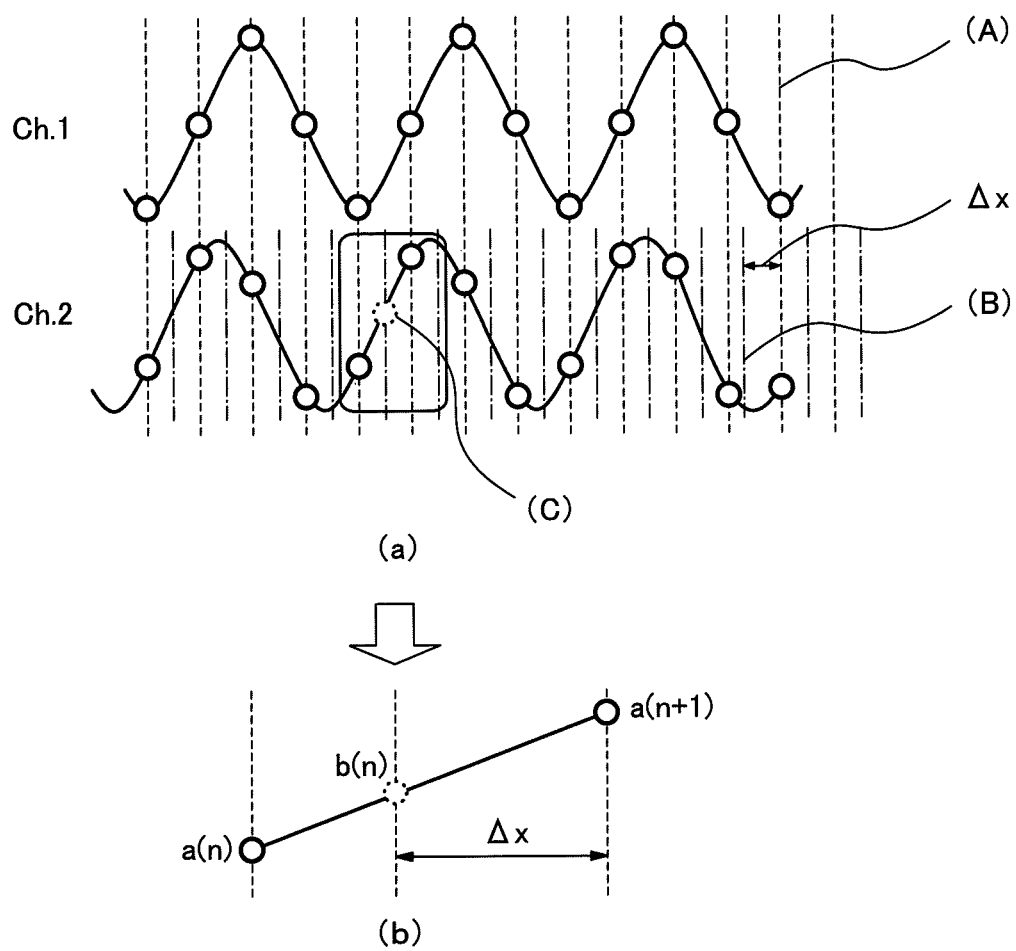
FIG. 2 is a diagram illustrating skew compensation using a linear interpolation method in detail.

FIG. 2 is a diagram illustrating skew compensation using the liner interpolation method as an example of operation of the skew compensation filter 103 in detail. FIG. 2 illustrates an example in which a sine wave is inputted as an input signal, A/D conversion is conducted with an oversampling frequency twice the frequency of the inputted sine wave, and skew (phase) of the channel 2 (Ch. 2) is compensated with reference to the channel 1 (Ch. 1).

In FIG. 2(a), (A) illustrates an example of sample timing of an A/D converter in a reference lane (Ch. 1). (B) illustrates an example of ideal sample timing on Ch. 2. $\Delta x$ illustrates skew between Ch. 1 and Ch. 2. (C) in FIG. 2 illustrates an example of a sample point of Ch. 2, on which skew compensation is conducted.

In the skew compensation based on the linear interpolation method, if a sample point value of the channel 2 before skew compensation is described as a (n) and the amount of skew compensation is described as $\Delta x$ (unit: sample=1/fs), a sample point value b(n) of the channel 2 after skew compensation is given by the following equation, $$b(n) = \Delta x \times a(n) + (1 - \Delta x) \times a(n+1) \quad (1)$$

FIG. 2(b) schematically illustrates linear interpolation of b(n) based on a(n) and a(n+1).

Figure 3:
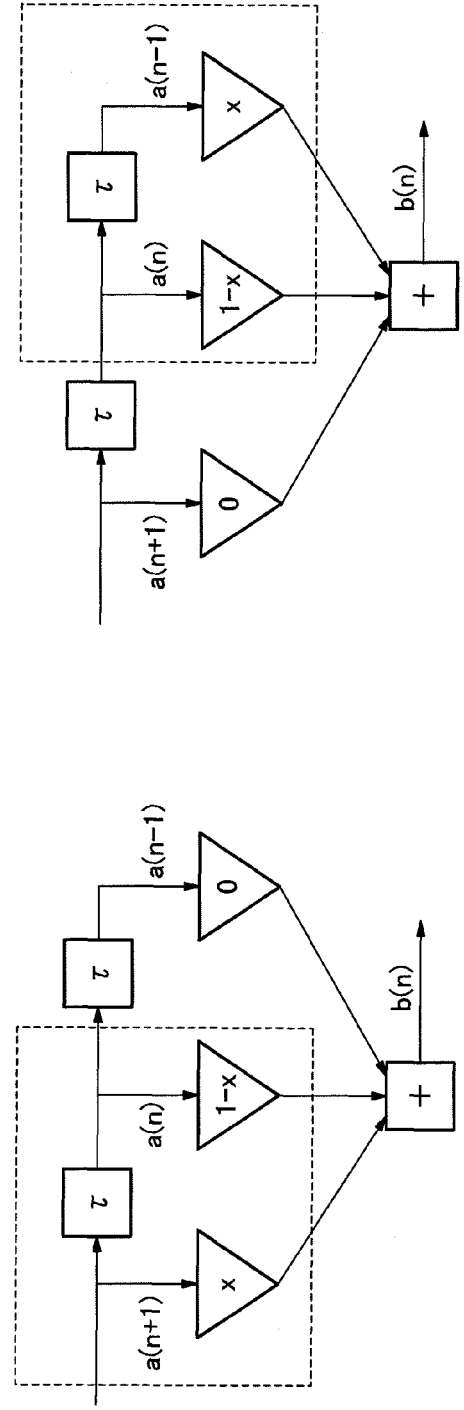
FIG. 3 is a diagram illustrating a configuration of a skew compensation filter employing a FIR filter.

A circuit having a FIR (finite impulse response) filter is known as a filter circuit achieving the linear interpolation. FIG. 3 is a diagram illustrating a configuration of a skew compensation filter employing the FIR filter.

FIG. 3 shows configurations of the skew compensation filter, in the following cases (a) the amount of skew compensation is $-x$ sample ($0<x<1$) and (b) the amount of skew compensation is $+x$ sample ($0<x<1$). In each case, if each tap coefficient is set appropriately, b (n) in the equation (1) can be calculated. FIG. 3 illustrates an example of 3-tap FIR filter. A higher degree FIR filter may be employed in order to conduct wide range skew compensation.

The problem which occurs when skew compensation using linear interpolation is conducted is that sampling rate of the A/D converter 101 cannot be fully increased due to limit of operation speed and consumed power in a high-speed communication of more than 10 G bps. Due to the limit, an over-sampling operation is usually conducted at one to two times a baud rate of a signal. As a result, the problem occurs that satisfactory filter characteristics are not obtained.

Figure 4:
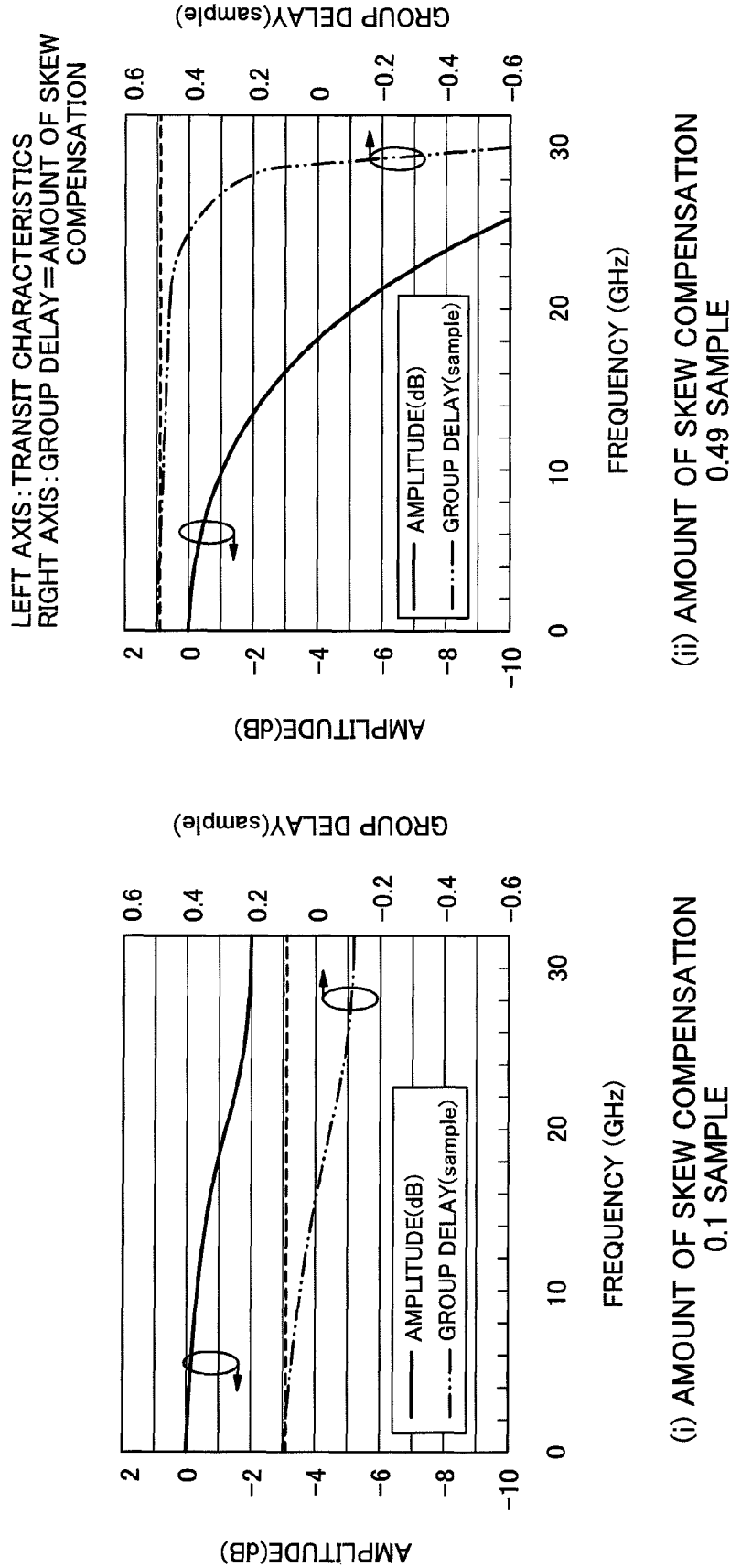
FIG. 4 is a diagram illustrating propagation characteristics of the skew compensation filter.

FIG. 4 is a diagram illustrating propagation characteristics of the skew compensation filter. FIG. 4 illustrates an example of calculated propagation characteristics in performance of 64 GS/s (Giga-Sample per second) with respect to a signal with 32 Gb/s using the FIR filter shown in FIG. 3. The example shows double over-sampling is performed. FIG. 4(i) and FIG. 4(ii) illustrate calculation results of propagation characteristics of FIR filter on the amount of skew compensation of 0.1 sample and the amount of skew compensation of 0.49 sample, respectively. In FIG. 4, a left axis represents amplitude characteristics (transit characteristics), and a right axis represents group delay characteristics (amount of skew compensation).

As shown in FIG. 4(i), when the amount of skew compensation is 0.1 sample, attenuation of amplitude characteristics is small even in a high-frequency (e.g. around 20 GHz) region (around 1.2 dB at 20 GHz, in FIG. 4). On the contrary, in FIG. 4(i), a frequency, at which 0.1 sample which is a desired amount of skew compensation as group delay is obtained, is around 10 GHz or less.

As shown in FIG. 4(ii), when the amount of skew compensation is 0.49 sample, amplitude is attenuated by about 5 dB in around 20 GHz. On the contrary, in FIG. 4(ii), desired performance of 0.49 sample is obtained up to around 20 GHz with respect to group delay (amount of skew compensation).

As described above, in the high-speed digital communication, performance of a waveform distortion compensation filter, like the skew compensation filter 104, may be insufficient, because the amount of over-sample in the A/D converter 101 is insufficient. In the skew compensation filter 104, therefore, waveform distortion may not be fully removed (compensated) or additional waveform distortion (deterioration of propagation characteristics) may further occur.

Furthermore, when the set value of the filter coefficient setting circuit 105 in the skew compensation filter 103 (e.g. amount of skew compensation (amount of group delay) in FIG. 4) is modified, other propagation characteristics (e.g. amplitude characteristics (transit characteristics) in FIG. 4) also changes. Therefore, stable system performance is not obtained.

The digital receiver of the first exemplary embodiment of the invention further includes the band compensation filter 104 to solve the above problem. The digital receiver of the first exemplary embodiment compensates deterioration of band characteristics due to the skew compensation filter 103 by using the band compensation filter 104 to achieve desired signal propagation characteristics.

If a method of skew compensation and an amount of skew compensation are determined, change of propagation characteristics due to the skew compensation filter 103 is determined uniquely. Therefore, when the band compensation filter 104 having propagation characteristics of suppressing propagation characteristics deterioration due to skew compensation is employed, it is possible to compensate additional waveform distortion which occurs in skew compensation filter 103. For example, a filter which does not change group delay characteristics of the skew compensation filter 103, and only amplitude characteristics of which is opposite to the characteristics of the skew compensation filter 103, may be employed as the band compensation filter 104. The band compensation filter 104 may be configured by using the FIR filter. The filter coefficient setting circuit 106 may calculate a filter coefficient by which desired characteristics opposite to characteristics of the skew compensation filter 103 is achieved in the band compensation filter 104. In the filter coefficient setting circuit 106, the set value of the band compensation filter 104 may be set by referring to the look-up table which is calculated in advance based on the set value of the filter coefficient setting circuit 105.

Deterioration of propagation characteristics which occurs in the skew compensation filter 103 does not need to be fully compensated. The set value of the filter coefficient setting circuit 106 only has to be determined so that proper system performance is obtained by considering allowable circuit size and consumed power and performance required for a system, like band characteristics, group delay characteristics and the like. The set value of the filter coefficient setting circuit 106 may be determined so that system performance, like an error rate, is optimized.

The skew compensation filter 103 with a linear interpolation circuit in FIG. 3 is one example of a skew compensation system, and other system is available as the skew compensation system. For example, a method using a higher-order FIR filter or a method of conducting rate conversion by using up-sampling and an interpolation filter may also conduct skew compensation. In both cases, the digital receiver 100 determines a set value of the filter coefficient setting circuit 107 by associating propagation characteristics of the skew compensation filter 103 with that of the band compensation filter and by considering circuit size and consumed power, and preferential performance (band characteristics, group delay characteristics) in the system. Thereby, a digital receiver with desired characteristics can be configured.

Including the band compensation filter with propagation characteristics of suppressing change of propagation characteristics due to the skew compensation filter, the digital receiver of the first exemplary embodiment can compensates additional waveform distortion which occurs in the skew compensation filter. Accordingly, the digital receiver of the first exemplary embodiment is well controllable and achieves distortion compensation with high performance and high accuracy.

Second Exemplary Embodiment

Figure 5:
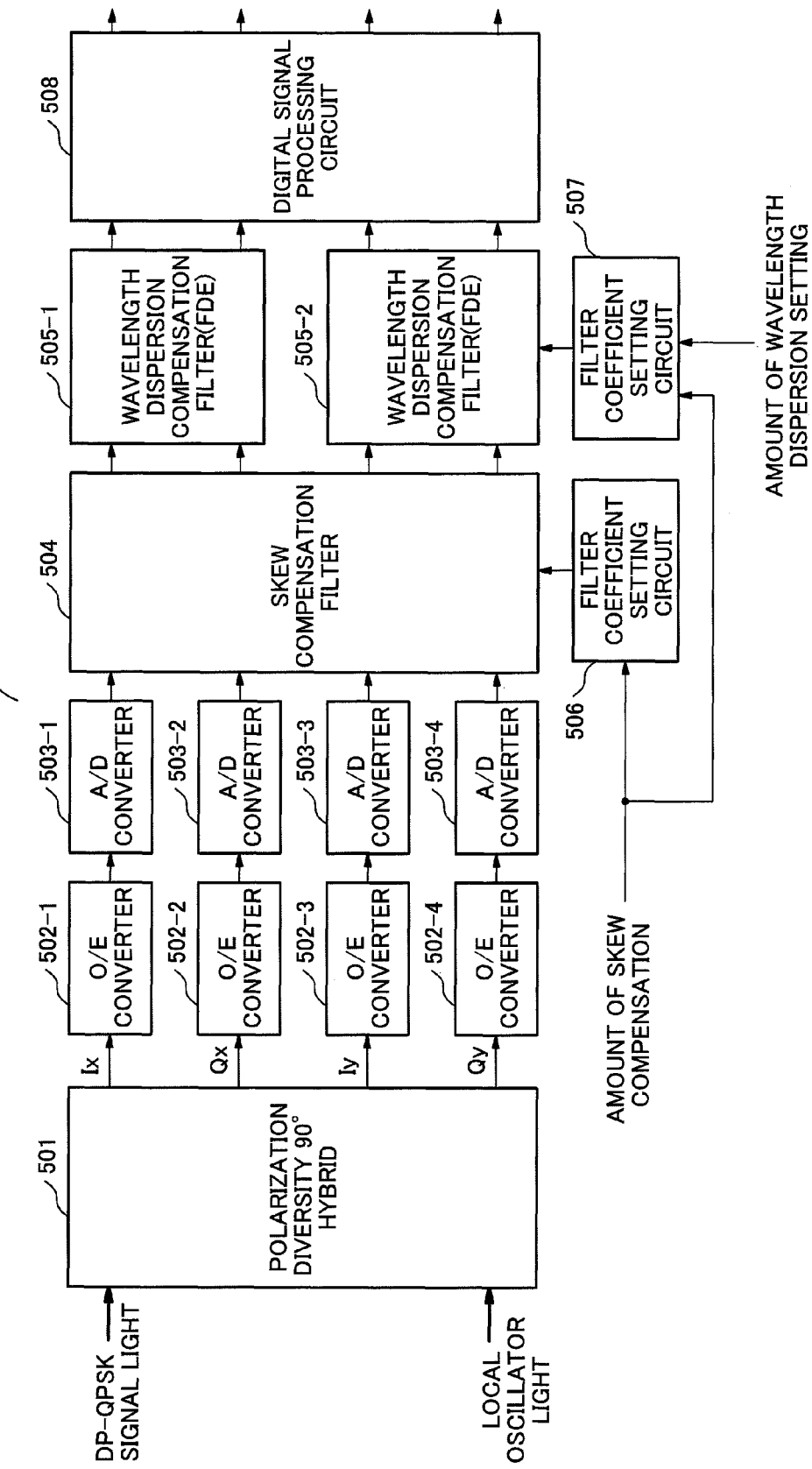
FIG. 5 is a diagram illustrating a configuration of a digital receiver related to a second exemplary embodiment of the invention.

Next, a second exemplary embodiment of the invention is described below. FIG. 5 is a diagram illustrating a configuration of a digital receiver 500 of the second exemplary embodiment of the invention. In FIG. 5, the digital receiver 500 includes a polarization diversity 90-degree hybrid 501, an optical-electric (O/E) converter 502, an A/D converter 503, a skew compensation filter 504 and a wavelength dispersion compensation filter 505. The digital receiver 500 further includes a filter coefficient setting circuit 506 related to the skew compensation filter, a filter coefficient setting circuit 507 related to the wavelength dispersion filter, and a digital signal processing circuit 508.

In FIG. 5, when a plurality of units having the same function are arranged, the units are distinguished by adding "-1" and "-2" to reference numerals thereof. In following descriptions, if it is unnecessary to particularly distinguish them, for example, "O/E converter 502-1" and "O/E converter 502-2" are described as "O/E converter 502".

An operation of the digital receiver 500 related to the second exemplary embodiment of the invention is described. In FIG. 5, a DP-QPSK signal light is a signal light transmitted from an optical transmitter which is not shown. The DP-QPSK signal light with waveform distortion due to wavelength dispersion of an optical fiber transmission path is received by the digital receiver 500 of the invention. The received DP-QPSK signal light is combined with a local oscillator light in the polarization diversity 90-degree hybrid 501 and is demodulated into 4 channels optical signals Ix, Qx, Iy, Qy.

The 4 demodulated signals Ix, Qx, Iy, Qy are converted to electric signals by the O/E converters (optical electric converter) 502-1 to 502-4, respectively. The signals Ix, Qx, Iy, Qy, which have been converted to electric signals, are converted into digital signals by the following A/D converters 503-1 to 503-4, respectively.

The skew compensation filter 504 compensates skew between channels of signals converted to the digital signals. The x polarization signals (Ix, Qx) and the y polarization signals (Iy, Qy), skew of which are compensated, enter the wavelength dispersion compensation filters 505-1 and 505-2, respectively.

The wavelength dispersion compensation filter 505 removes (compensates) waveform distortion which is included in the inputted signals and is caused by wavelength dispersion added in the optical transmission path. Outputs of the wavelength dispersion compensation filter 505 enter the digital signal processing circuit 508. The digital signal processing circuit 508 gives, to the inputted signals, digital signal processing, like clock extraction, returning, polarization tracking, local oscillator light phase estimation, and the like. Since the detailed processes in the digital signal processing circuit 508 has no relation with the invention and is described in Non-Patent Document 1 to be publicly known, descriptions thereof is omitted.

Figure 6:
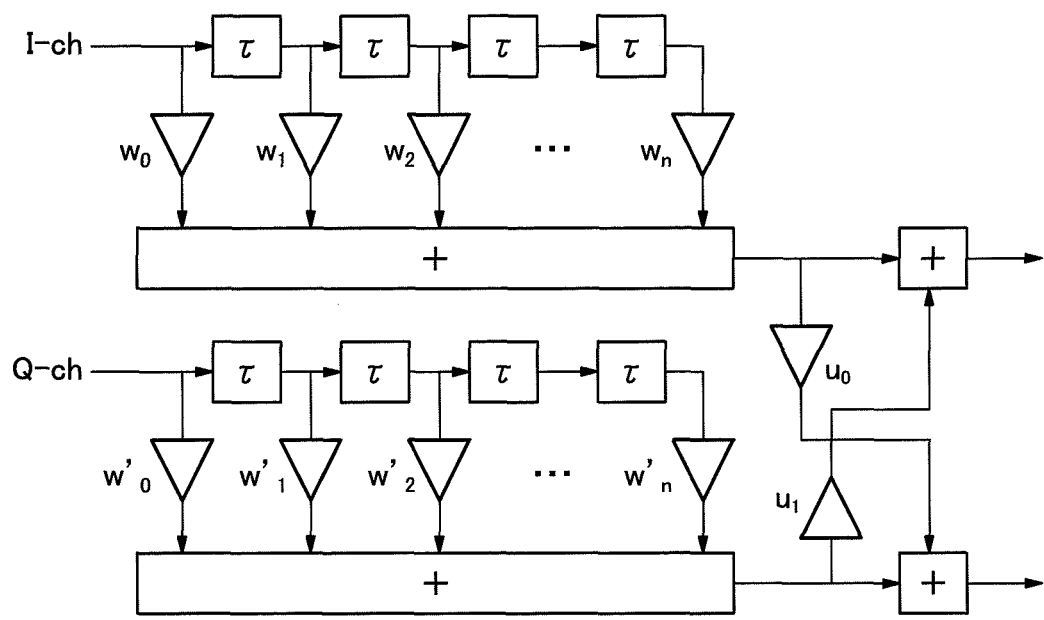
FIG. 6 is a block diagram illustrating a schematic configuration of the skew compensation filter.

The skew compensation filter 504 in the digital receiver 500 of the second exemplary embodiment of the invention may be the filter conducting linear interpolation, shown in FIG. 3, just like the digital receiver 100 of the first exemplary embodiment of the invention. Or a filter which is configured by combining butterfly-typed FIR filters compensating crosstalk between the Ix (Iy) channel and the Qx (Qy) channel, as shown in FIG. 6, may also be employed as the skew compensation filter 504.

Figure 7:
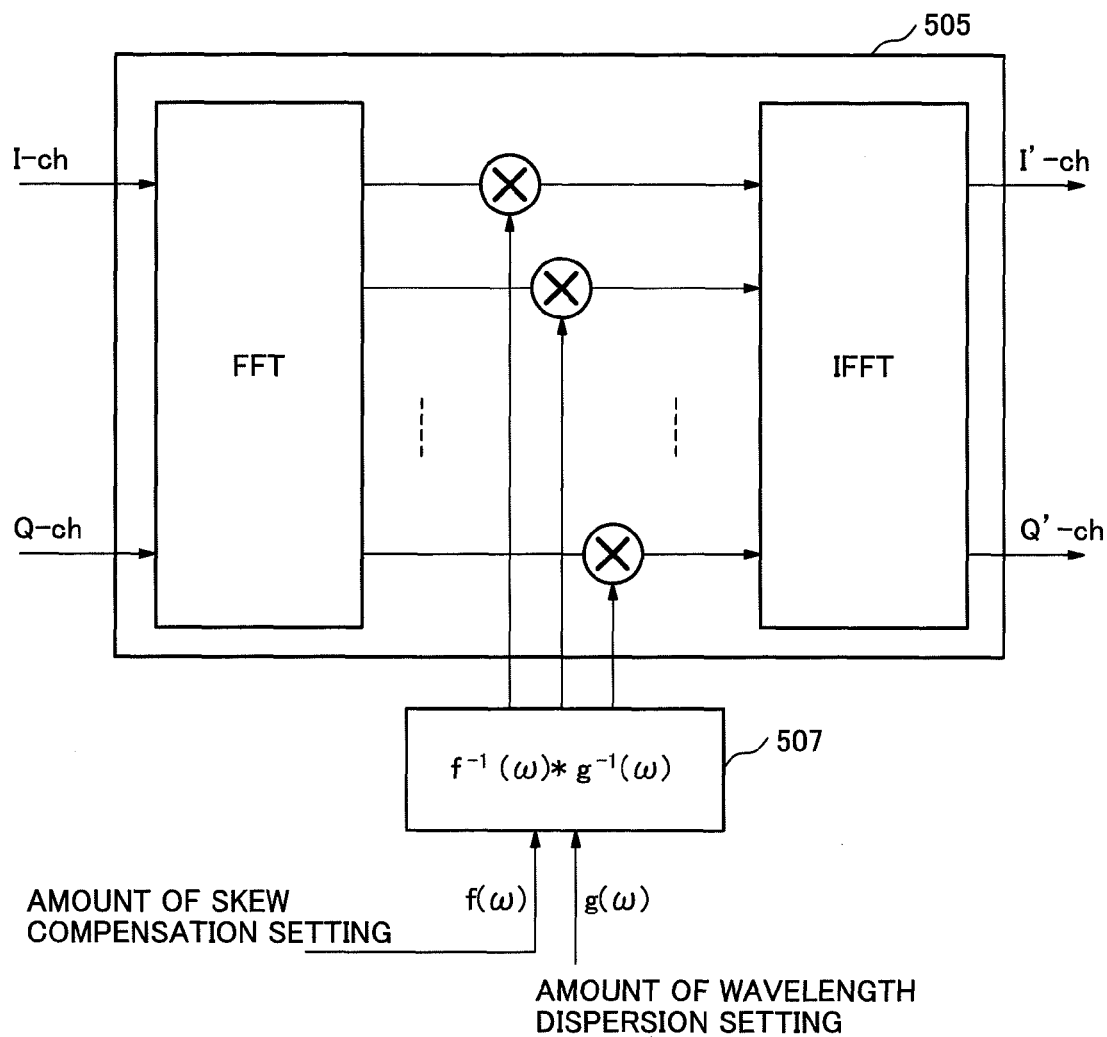
FIG. 7 is a diagram illustrating a configuration of a wavelength dispersion compensation filter based on frequency region waveform equalization.

FIG. 7 is a diagram illustrating a configuration of the FDE (frequency domain equalization) wavelength dispersion compensation filter 505. In FIG. 7, the signals of I-ch and Q-ch enter a FFT (fast Fourier transform) circuit and are converted into complex frequency region signals. Weighted multiplication is performed on signals converted to the complex frequency region signals by a set value of a filter coefficient of the filter coefficient setting circuit 507 related to the wavelength dispersion compensation filter, IFFT (inverse FFT) is further performed thereon, and the signals are converted into time domain signals and outputted.

The filter coefficient setting circuit 507 calculates the product of the inverse function $f^{-1}(\omega)$ of the function $f(\omega)$ representing deterioration of propagation characteristic of the skew compensation filter 504 and the inverse function $g^{-1}(\omega)$ of the propagation characteristics $g(\omega)$ related to wavelength dispersion compensation, as a filter coefficient. Accordingly, it becomes possible to compensate waveform distortion added by the skew compensation filter 504 by using the wavelength dispersion compensation filter 505. The function $f(\omega)$ representing deterioration of propagation characteristic of the skew compensation filter 504 is a function extracting only amplitude characteristics (an absolute value of propagation characteristics of the skew compensation filter 504) of the graph in FIG. 4.

The wavelength dispersion compensation filter 505 does not need to fully compensate deterioration of propagation characteristics occurred in the skew compensation filter 504, just like the digital receiver 100 of the first exemplary embodiment of the invention. A set value of the filter coefficient setting circuit 507 may be determined so that specifications suitable for the system are satisfied, based on circuit size and consumed power allowable for the digital receiver 500 and band characteristics and group delay characteristics allowable for the system.

In the above exemplary embodiment, the DP-QPSK signal is exemplified as an input signal. The invention may be applied to a signal of various modulation systems, like ASK (amplitude shift keying), BPSK (binary PSK), SP (single polarization)-QPSK, OFDM (orthogonal frequency division multiplexing) signal.

As described above, the digital receiver of the second exemplary embodiment calculates the product of the inverse function $f^{-1}(\omega)$ of the function $f(\omega)$ representing deterioration of propagation characteristic of the skew compensation filter and the inverse function $g^{-1}(\omega)$ of the propagation characteristics $g(\omega)$ related to wavelength dispersion compensation, as a filter coefficient. The digital receiver of the second exemplary embodiment compensates waveform distortion added by the skew compensation filter by using the wavelength dispersion compensation filter. Accordingly, the digital receiver of the second exemplary embodiment is well controllable and achieves distortion compensation with high performance and high accuracy.

Third Exemplary Embodiment

Figure 8:
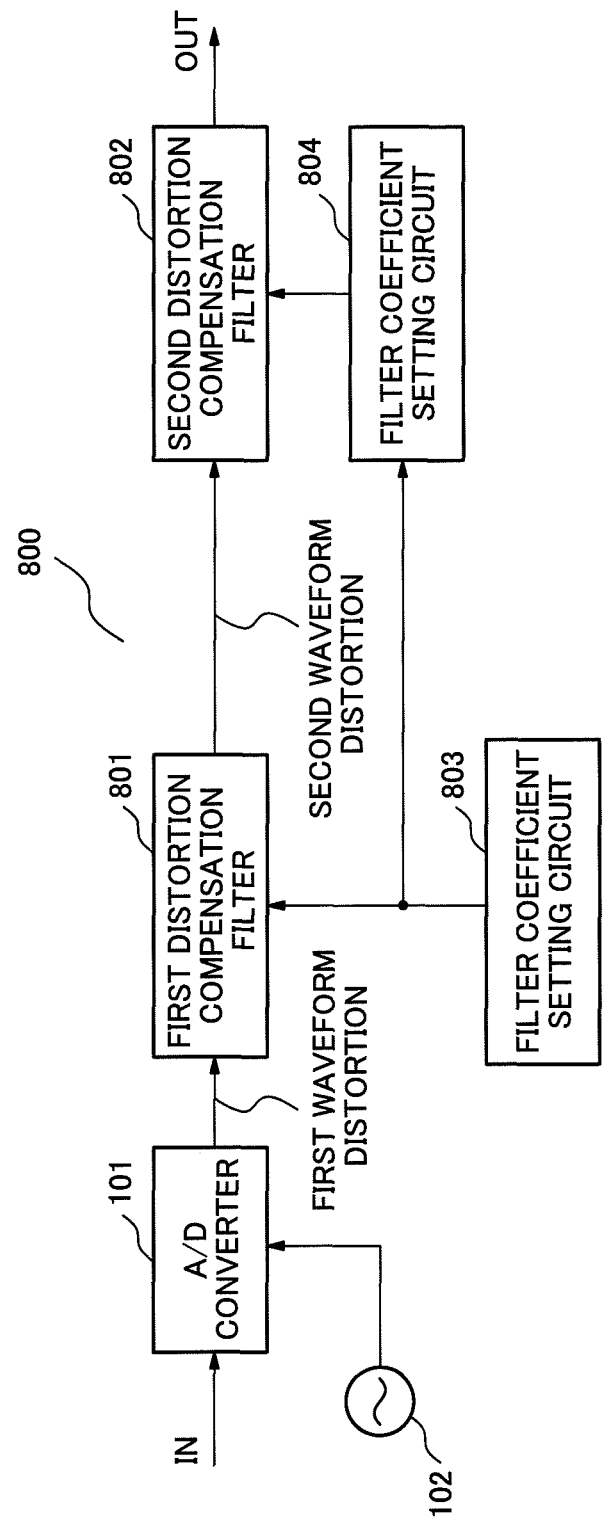
FIG. 8 is a diagram illustrating a configuration of a digital receiver related to a third exemplary embodiment of the invention.

Next, a third exemplary embodiment of the invention is described. FIG. 8 is a diagram illustrating a digital filter 800 of the third exemplary embodiment of the invention. In FIG. 8, the digital filter 800 includes an A/D converter 101, an A/D converter identification clock 102, a first distortion compensation filter 801 and a second distortion compensation filter 802. The digital filter 800 further includes a filter coefficient setting circuit 803 related to the first distortion compensation filter and a filter coefficient setting circuit 804 related to the second distortion compensation filter.

An operation of the digital filter 800 is described below. In the digital filter 800 shown in FIG. 8, a signal, which is received by a receiver through a transmission path and is O/E-converted, enters the A/D converter 101. The A/D converter 101 converts the inputted signal, which is an analog electric signal, into a digital signal at the timing in synchronization with the A/D converter identification clock 102.

The first distortion compensation filter 801 is a filter which conducts waveform distortion compensation of first waveform distortion which is added to a signal at a transmitter, a transmission path, an optical front-end part, the A/D converter 101, and the like, based on a filter set value of the filter coefficient setting circuit 803 related to the first distortion compensation filter. In high-speed digital communication, however, sufficient compensation performance may not be obtained in the first distortion compensation filter 801. In this case, output of the first distortion compensation filter 801 includes second waveform distortion including residual waveform distortion which the first distortion compensation filter 801 cannot remove (compensate) and waveform distortion which is added by the first distortion compensation filter 801. The filter coefficient setting circuit 804 installs, into the second distortion compensation filter 802, a filter coefficient to achieve propagation characteristics suppressing change of propagation characteristics which additionally occurs at the first distortion compensation filter 801, based on set information of the filter coefficient setting circuit 803.

The digital filter 800 of the third exemplary embodiment works to associate propagation characteristics of the first distortion compensation filter with propagation characteristics of the second distortion compensation filter. As a result, even when it is difficult for the first distortion compensation filter alone to sufficiently achieve distortion compensation, the digital filter 800 is well-controllable and achieves distortion compensation with high performance and high accuracy.

The first distortion compensation filter 801 and the second distortion compensation filter 802 may not necessarily be separated filters in circuit implementation. For example, the first distortion compensation filter 801 and the second distortion compensation filter 802 may be configured as one high-order FIR filter. In this case, filter coefficient calculation on the filter coefficient setting circuit 803 and filter coefficient calculation on the filter coefficient setting circuit 804 may be separated to set coefficients, based on the process equivalent to the above. Even if the first distortion compensation filter 801 and the second distortion compensation filter 802 is configured as one high-order FIR filter, controllability equivalent to that of the configuration including these filters separately is obtained by carrying out each filter coefficient calculation individually.

First Modified Example of the Third Exemplary Embodiment

In FIG. 8, the digital filter 800 without the A/D converter 101 and the A/D converter identification clock 102 may compensate distortion of an inputted signal based on processes similar to the processes described in the third exemplary embodiment.

That is, the digital filter 800 may be the configuration including only the first distortion compensation filter 801, the second distortion compensation filter 802, the filter coefficient setting circuit 803 related to the first distortion compensation filter and the filter coefficient setting circuit 804 related to the second distortion compensation filter.

In this configuration, it is possible to operate the digital filter 800 so as to associate propagation characteristics of the first distortion compensation filter 801 with propagation characteristics of the second distortion compensation filter 802 based on processes similar to the processes described in the third exemplary embodiment. Even if the A/D converter and the A/D converter identification clock are not included, the digital filter of the first modified example of the third exemplary embodiment is well controllable and achieves distortion compensation with high performance and high accuracy.

Second Modified Example of the Third Exemplary Embodiment

Figure 9:
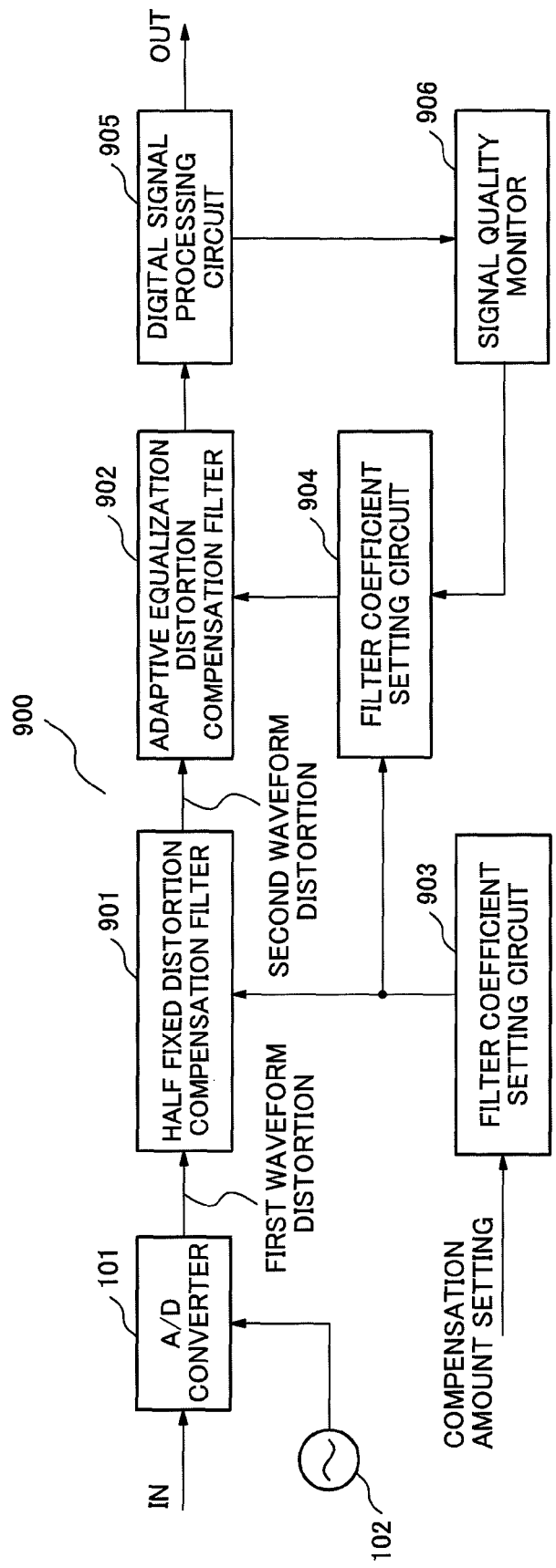
FIG. 9 is a diagram illustrating modified example of the configuration of the digital receiver related to the third exemplary embodiment of the invention.
Figure 10:
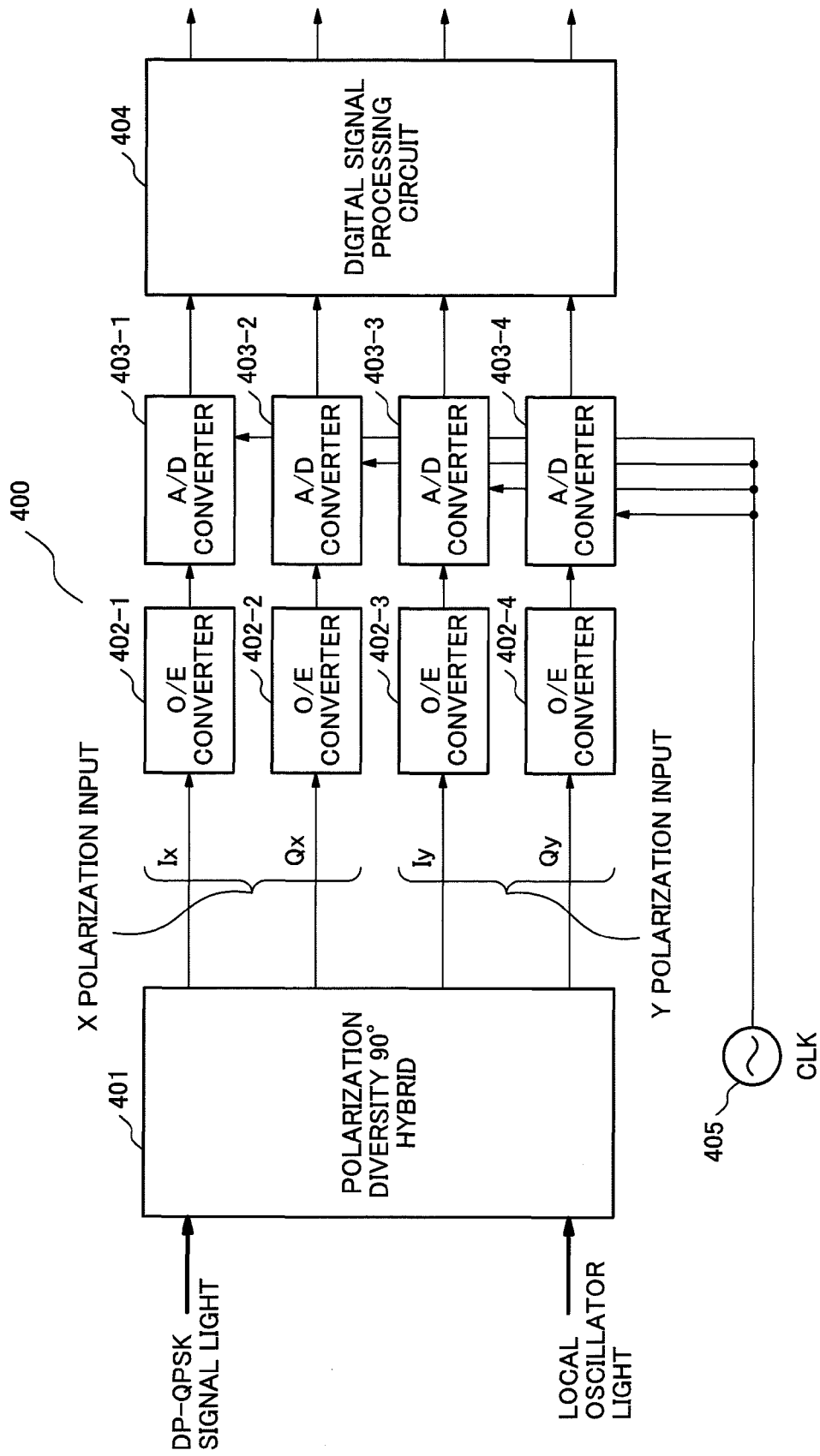
FIG. 10 is a diagram illustrating a configuration of a digital coherent receiver related to the invention.

FIG. 9 is a diagram illustrating a digital filter 900 of the modified example of the digital filter 800 related to the third exemplary embodiment of the invention. In FIG. 9, the digital filter 900 includes a half fixed distortion compensation filter 901, an adaptive equalization distortion compensation filter 902, a filter coefficient setting circuit 903 related to the half fixed distortion compensation filter, a filter coefficient setting circuit 904 related to the adaptive equalization filter, a digital signal processing circuit 905 and a signal quality monitor 906.

The digital filter 900 differs from the digital filter 800 of the third exemplary embodiment of the invention in the configuration of the employed waveform distortion filter, and the other configuration thereof is similar to the configuration of the third exemplary embodiment. Therefore, the same reference numerals as those of the digital receiver 800 are given to the corresponding parts of the digital filter 900, and descriptions thereabout are omitted.

Operations of the digital filter 900 are described below. In FIG. 9, the filter coefficient setting circuit 903 sets the filter coefficient of the half fixed distortion compensation filter 901 based on compensation amount setting information. The adaptive equalization distortion compensation filter 902 conducts adaptive equalization based on LMS (least mean square) algorithm or the like by using a decision feedback signal or a training signal or the like. The digital receiver 900 may conduct adaptive equalization based on information of the signal quality monitor 906 like an error rate, a waveform monitor, or the like. In this case, if filter coefficient calculation of the filter coefficient setting circuit 904 is conducted based on setting information set by the filter coefficient setting circuit 903, by preliminarily considering, aside from adaptive equalization, additional fixed distortion due to the half fixed distortion compensation filter 901, convergence and controllability of adaptive equalization can be improved.

Waveform distortion which can be compensated by the half fixed distortion compensation filter 901 is, for example, waveform distortion in the transmitter, the transmission path, and the optical front-end part (each not shown) and distortion due to calibration error on the A/D converter 101. The present modified example may be applied to compensation for distortion due to a band limitation filter of a duo-binary modulation system, distortion due to a conversion filter from a RZ (return-to-zero) signal to a NRZ (non-RZ) signal, and the like.

The digital filter device of the second modified example of the third exemplary embodiment is well controllable and achieves distortion compensation with high performance and high accuracy.

The function of each exemplary embodiment described above may be achieved by a computer. The digital receiver or the digital filter device in each exemplary embodiment may include a central processing unit and memory. The central processing unit may achieve the function of the digital receiver or the digital filter device in each exemplary embodiment by executing a program stored in the memory.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2010-195370 filed on Sep. 1, 2010, the disclosure of which is incorporated herein in its entirety by reference.

The whole or part of the exemplary embodiments disclosed above can be described as, but not limited to, the following supplementary notes.

[Supplementary Note 1]

A digital filter device including a first distortion compensation filter unit for conducting distortion compensation of first waveform distortion included in an inputted signal through digital signal processing, a first filter coefficient setting unit for setting a filter coefficient of the first distortion compensation filter unit, a second distortion compensation filter unit for compensating second waveform distortion included in a signal outputted from the first distortion compensation filter unit, and a second filter coefficient setting unit for setting a filter coefficient of the second distortion compensation filter unit based on the filter coefficient set by the first filter coefficient setting unit.

[Supplementary Note 2]

The digital filter device described in the Supplementary note 1, wherein the second filter coefficient setting unit sets the filter coefficient of the second distortion compensation filter unit to suppress change of propagation characteristics caused by the first distortion compensation filter.

[Supplementary Note 3]

The digital filter device described in the Supplementary note 1, wherein the second filter coefficient setting unit sets the filter coefficient of the second distortion compensation filter unit to suppress change of amplitude characteristics caused by the first distortion compensation filter unit.

[Supplementary Note 4]

The digital filter device described in any one of the Supplementary note 1 to the Supplementary note 3, wherein the first distortion compensation filter unit is a skew compensation unit to compensate skew of an inputted signal.

[Supplementary Note 5]

The digital filter device described in the Supplementary note 4, wherein the skew compensation unit includes a FIR (finite impulse response) filter, and the first filter coefficient setting unit calculates a filter coefficient of the FIR filter in response to predetermined skew compensation characteristics.

[Supplementary Note 6]

The digital filter device described in any one of the Supplementary note 1 to the Supplementary note 5, wherein the second filter coefficient setting unit sets the filter coefficient of the second distortion compensation filter unit by using a look-up table which is prepared in advance based on characteristics of the first distortion compensation filter unit.

[Supplementary Note 7]

The digital filter device described in any one of the Supplementary note 1 to the Supplementary note 6, wherein the second distortion compensation filter unit includes a frequency region equalization circuit.

[Supplementary Note 8]

The digital filter device described in the Supplementary note 7, wherein the second filter coefficient setting unit calculates the filter coefficient based on a product of a function to represent characteristics suppressing propagation characteristics of the first distortion compensation filter and a function to represent characteristics suppressing dispersion characteristics of an inputted signal.

[Supplementary Note 9]

The digital filter device described in any one of the Supplementary note 1 to the Supplementary note 8, wherein the second distortion compensation filter unit includes FIR filter.

[Supplementary Note 10]

The digital filter device described in any one of the Supplementary note 1 to the Supplementary note 9, further includes a digital signal processing unit for digitally processing a signal outputted from the second distortion compensation filter unit and a signal quality monitor unit for monitoring quality of a signal outputted from the digital signal processing unit, wherein the second filter coefficient setting unit determines the filter coefficient of the second distortion compensation filter unit based on a monitoring result of the signal quality monitor.

[Supplementary Note 11]

The digital filter device described in the Supplementary note 10, wherein the signal quality monitor is an error rate monitor or a waveform monitor.

[Supplementary Note 12]

The digital filter device described in any one of the Supplementary note 1 to the Supplementary note 11, further including an A/D conversion unit for converting an inputted analog signal into a digital signal and inputting the converted digital signal into the first distortion compensation filter unit, wherein an output of the A/D conversion unit enters the first distortion compensation filter unit.

[Supplementary Note 13]

The digital filter device described in the Supplementary note 12, wherein the inputted analog signal is a signal to which an optical signal is optoelectric-converted.

[Supplementary Note 14]

The digital filter device described in the Supplementary note 13, wherein the inputted analog signal is a signal to which an optical PSK (phase shift keying) signal is optoelectric-converted.

[Supplementary Note 15]

A digital receiver, wherein a received signal enters the digital filter device described in any one of the Supplementary note 1 to the Supplementary note 14.

[Supplementary Note 16]

A communication system, wherein a transmitted signal is received by the digital receiver described in the Supplementary note 15.

[Supplementary Note 17]

A digital filtering method, including setting a filter coefficient of a first distortion compensation filter unit, compensating distortion of first waveform distortion included in an inputted signal, setting a filter coefficient of a second distortion compensation filter unit based on the filter coefficient of first distortion compensation filter unit, and compensating second waveform distortion included in a signal outputted from the first distortion compensation filter unit.

[Supplementary Note 18]

A control program of a digital filter device causing a computer of the digital filter device to function as a first distortion compensation filter unit for conducting distortion compensation of first waveform distortion included in an inputted signal through digital signal processing, a first filter coefficient setting unit for setting a filter coefficient of the first distortion compensation filter unit, a second distortion compensation filter unit for compensating second waveform distortion included in a signal outputted from the first distortion compensation filter unit, and a second filter coefficient setting unit for setting a filter coefficient of the second distortion compensation filter unit based on the filter coefficient set by the first filter coefficient setting unit.

EXPLANATION ON REFERENCE NUMERAL

100, 500, 800, 900 digital receiver
101 A/D converter
102 A/D converter identification clock
103 skew compensation filter
104 band compensation filter
105 filter coefficient setting circuit
106 filter coefficient setting circuit
107 digital signal processing circuit
400 digital coherent receiver
401 polarization diversity 90-degree hybrid
402 O/E converter
403 A/D converter
404 digital signal processing circuit
405 reference sampling clock
501 polarization diversity 90-degree hybrid
502 O/E converter
503 A/D converter
504 skew compensation filter
505 wavelength dispersion compensation circuit
506 filter coefficient setting circuit
507 filter coefficient setting circuit
508 digital signal processing circuit
801 first distortion compensation filter
802 second distortion compensation filter
803 filter coefficient setting circuit
804 filter coefficient setting circuit
901 half fixed distortion compensation filter
902 adaptive equalization distortion compensation circuit
903 filter coefficient setting circuit
904 filter coefficient setting circuit
905 digital signal processing circuit
906 signal quality monitor

The invention claimed is:

1. A digital filter device, comprising:
    a first distortion compensation filter unit configured to conduct distortion compensation of first waveform distortion, included in an inputted signal, through digital signal processing;
    a first filter coefficient setting unit configured to set a filter coefficient of the first distortion compensation filter unit based on an amount of compensation for the inputted signal;
    a second distortion compensation filter unit that compensates second waveform distortion included in a signal outputted from the first distortion compensation filter unit; and
    a second filter coefficient setting unit configured to set a filter coefficient of the second distortion compensation filter unit based on the filter coefficient set by the first filter coefficient setting unit, the filter coefficient of the second distortion compensation filter unit being set independently from an amount of waveform distortion of the inputted signal.

2. The digital filter device of claim 1, wherein the second filter coefficient setting unit is further configured to set the filter coefficient of the second distortion compensation filter unit so as to suppress change of propagation characteristics caused by the first distortion compensation filter.

3. The digital filter device of claim 1, wherein the second filter coefficient setting unit is further configured to set the filter coefficient of the second distortion compensation filter unit so as to suppress change of amplitude characteristics caused by the first distortion compensation filter unit.

4. The digital filter device of claim 1, wherein the first distortion compensation filter unit is a skew compensation unit adapted to compensate skew of an inputted signal.

5. The digital filter device of claim 4, wherein the skew compensation unit includes a FIR (finite impulse response) filter and wherein the first filter coefficient setting unit calculates a filter coefficient of the FIR filter in response to predetermined skew compensation characteristics.

6. The digital filter device of claim 1, wherein the second distortion compensation filter unit includes a frequency domain equalization circuit.

7. The digital filter device of claim 1, further comprising:
    a digital signal processing unit configured to digitally process a signal outputted from the second distortion compensation filter unit; and
    a signal quality monitor unit configured to monitor a quality of a signal outputted from the digital signal processing unit;
    wherein the second filter coefficient setting unit is further configured to determine the filter coefficient of the second distortion compensation filter unit based on a monitoring result of the signal quality monitor.

8. The digital filter device of claim 1, further comprising:
    an A/D conversion unit configured to convert an inputted analog signal into a digital signal and to input the converted digital signal into the first distortion compensation filter unit,
    wherein an output of the A/D conversion unit enters the first distortion compensation filter unit.

9. The digital filter device of claim 1, wherein:
the first distortion compensation filter unit is a skew compensation unit adapted to compensate skew of an inputted signal, and
the second filter coefficient setting unit is further configured to set the filter coefficient of the second distortion compensation filter unit so as to suppress the change of one of propagation characteristics and amplitude characteristics caused by the first distortion compensation filter unit.

10. A digital filtering method, comprising:
setting a filter coefficient of a first distortion compensation filter unit based on an amount of compensation for an inputted signal;
compensating distortion of first waveform distortion included in the inputted signal;
setting a filter coefficient of a second distortion compensation filter unit based on the filter coefficient of the first distortion compensation filter unit, the filter coefficient of the second distortion compensation filter unit being set independently from an amount of waveform distortion of the inputted signal; and
compensating second waveform distortion included in a signal outputted from the first distortion compensation filter unit.

11. A non-transitory computer-readable recording medium storing a control program configured to enable a processor of a digital filter device to implement:
a first distortion compensation filter unit configured to conduct distortion compensation of first waveform distortion, included in an inputted signal, through digital signal processing;
a first filter coefficient setting unit configured to set a filter coefficient of the first distortion compensation filter unit based on an amount of compensation for the inputted signal;
a second distortion compensation filter unit configured to compensate second waveform distortion included in a signal outputted from the first distortion compensation filter unit; and
a second filter coefficient setting unit configured to set a filter coefficient of the second distortion compensation filter unit based on the filter coefficient set by the first filter coefficient setting unit, the filter coefficient of the second distortion compensation filter unit being set independently from an amount of waveform distortion of the inputted signal.

* * * * *

UNITED STATES PATENT AND TRADEMARK OFFICE
CERTIFICATE OF CORRECTION

PATENT NO. : 8,831,081 B2  
APPLICATION NO. : 13/393066  
DATED : September 9, 2014  
INVENTOR(S) : Junichi Abe et al.

Page 1 of 1

It is certified that error appears in the above-identified patent and that said Letters Patent is hereby corrected as shown below:

In the Specification

Column 8, Line 14: Delete "returning," and insert -- retiming, --

Signed and Sealed this
Twenty-fourth Day of February, 2015

Michelle K. Lee
*Deputy Director of the United States Patent and Trademark Office*